United States Patent [19]

Gutknecht

[11] 4,065,781
[45] Dec. 27, 1977

[54] INSULATED-GATE THIN FILM TRANSISTOR WITH LOW LEAKAGE CURRENT

[75] Inventor: Peter Gutknecht, Liebefeld, Switzerland

[73] Assignee: Westinghouse Electric Corporation, Pittsburgh, Pa.

[21] Appl. No.: 481,729

[22] Filed: June 21, 1974

[51] Int. Cl.² ............... H01L 29/78; H01L 27/12
[52] U.S. Cl. ............................. 357/23; 357/4; 357/15; 357/16; 357/41; 357/49
[58] Field of Search ............... 357/4, 15, 23, 41, 16

[56] References Cited

U.S. PATENT DOCUMENTS

| | | | |
|---|---|---|---|
| 3,283,221 | 11/1966 | Heiman | 357/23 |
| 3,304,469 | 2/1967 | Weimer | 357/4 |
| 3,391,354 | 7/1968 | Ohashi et al. | 357/23 |
| 3,493,812 | 2/1970 | Weimer | 357/4 |
| 3,541,678 | 11/1970 | McDonald | 357/23 |
| 3,590,471 | 7/1971 | Lepselter et al. | 357/15 |
| 3,671,820 | 6/1972 | Haering et al. | 357/4 |
| 3,739,240 | 6/1973 | Krambeck | 357/15 |

OTHER PUBLICATIONS

Sze, Physics of Semiconductor Devices, Wiley-Interscience, N.Y., 1969, pp. 567-586.

Primary Examiner—William D. Larkins
Attorney, Agent, or Firm—C. L. Menzemer

[57] ABSTRACT

An insulated-gate thin film transistor is provided with low leakage drain current. A second semiconductor layer makes contact with the source electrode and the semiconductor layer forming the channel of the transistor at least between the source and drain electrodes. The second semiconductor layer is of opposite type conductivity from the channel semiconductor layer and preferably forms a PN heterojunction with the channel semiconductor layer. Alternatively, a metal layer may be used in place of the second semiconductor to form a Schottky-barrier junction with the channel semiconductor layer instead of a PN junction. Preferably, the channel semiconductor layer and the second semiconductor layer or the metal layer are sequentially evaporation deposited through the same deposition mask onto a substrate from evaporant sources spaced substantially different distances from the substrate so that the sequential layers are deposited on first and second overlapping areas of the substrate.

8 Claims, 9 Drawing Figures

INSULATED-GATE THIN FILM TRANSISTOR WITH LOW LEAKAGE CURRENT

FIELD OF THE INVENTION

The present invention relates to semiconductor devices and particularly insulated-gate thin film transistors.

BACKGROUND OF THE INVENTION

Insulated-gate thin film transistors are well known, see, e.g., Sze, *Physics of Semiconductor Devices*, pp. 567–86 (1969). Thin film transistors utilize evaporated semiconductor, metal and insulator layers to form a device which functions essentially as an MOS field-effect transistor. Unlike a field-effect transistor, a thin film transistor has, however, source and drain electrodes essentially ohmically connected to the semiconductor channel, and may have a semiconductor channel of amorphous or polycrystalline material.

Insulated gate transistors have two operating modes: the depletion mode and the enhancement mode. In the depletion mode, the conducting channel exists with zero gate-bias, and the insulated gate is reverse biased to deplete the charge carriers of the channel and reduce the channel's conductance. In the enhancement mode, the insulating gate is forward biased which enhances the charge carriers of the channel and increases the channel's conductance.

Even in the enhancement mode, thin film transistors have a certain drain current at zero gate voltage. This leakage current ($I_{OD}$) constitutes a part of the total drain current ($I_{D\ TOTAL}$) which cannot be modulated with gate voltage ($V_G$). To a first approximation, the drain leakage current is a constant independent of the applied gate voltage. The total drain current is, therefore, given as $I_{D\ TOTAL} = I_D + I_{OD}$ where $I_D$ is the portion of the drain current which can be modulated. For a properly operational insulated-gate thin film transistor, it is thus necessary that the leakage current ($I_{OD}$) be much less than the total drain current ($I_{D\ TOTAL}$).

Generally, the leakage current has been minimized by minimizing the thickness of the semiconductor layer. However, there is a minimum thickness of semiconductor material which can be deposited reproducibly. Thus, the presence of leakage current continues to be a restricting factor on insulated-gate thin film transistors. Thin film transistors built with tellurium semiconductor material having high carrier densities and mobilities have appreciable leakage currents even at minimum layer thickness.

The present invention overcomes the difficulty of prior thin film transistors. It provides an insulated-gate thin film transistor with substantially reduced drain leakage current and in turn provides a thin film transistor utilizable in applications where thin film transistors could not previously be used.

SUMMARY OF THE INVENTION

An insulated-gate thin film transistor is provided having low drain leakage current. A substrate is provided having opposed major surfaces and including electrically insulating material adjoining at least one major surface. The substrate has disposed on at least one said major surface, adjoining an electrically insulating material, a conductor layer of an electrically conductive material to form a gate electrode. An insulator layer of an electrically insulating material is disposed on and preferably covering the conductor layer. Alternatively, the gate electrode may be formed integral with the substrate by having the substrate of an electrically conductive material adjoining a major surface where the insulator layer is disposed.

Source and drain electrodes of electrically conductive material are then disposed on the insulator layer. The source and drain electrodes are spaced from each other to form a gap therebetween. A first thin semiconductor layer of semiconductor material is then disposed in contact with the source and drain electrodes and with the insulator layer at least between the source and drain electrodes to form the channel for the transistor. A second thin semiconductor layer of semiconductor material is then disposed in contact with the source electrode and with the first semiconductor layer at least between the source and drain electrodes. The second semiconductor layer is of opposite conductivity type from the first semiconductor layer and forms a PN function and preferably a PN heterojunction with the first semiconductor layer at least between the source and drain electrodes.

Alternatively, a metal layer may be utilized in place of the second semiconductor layer. The metal layer is of a material to form a Schottky-barrier junction with the first semiconductor layer at least between the source and drain electrodes.

In still another embodiment, the structure of the transistor is inverted. The supporting substrate again has at least portions thereof adjoining at least one major surface of electrically insulating material. A first thin semiconductor layer of semiconductor material is disposed on at least one major surface of the substrate adjoining electrically insulating material. Then a second thin semiconductor layer of semiconductor material is disposed on the first semiconductor layer, said second semiconductor layer being of opposite type conductivity from the first semiconductor layer and forming a PN junction and preferably a PN heterojunction with the first semiconductor layer. Alternatively, a metal layer can be used in place of the first semiconductor layer to form a Schottky-barrier junction with the second semiconductor layer.

Source and drain electrodes are then disposed on the second semiconductor layer. The source and drain electrodes are spaced apart from each other, and the source electrode may extend to contact the first semiconductor layer or alternatively, the metal layer. An insulator layer of electrically insulating material is then disposed in contact with the source and drain electrodes and the second semiconductor layer at least between the source and drain electrodes. A conductor layer of electrically conductive material is then disposed on the insulator layer at least between the source and drain electrodes to form a gate electrode and complete the thin film transistor.

Preferably, the thin film transistor is formed by depositing consecutive layers such as the first and second semiconductor layers through the same deposition mask. Specifically, first and second evaporant sources are formed and then disposed in a vacuum chamber spaced from each other. In addition, disposed in the vacuum chamber is a substrate, prepared for vapor deposition thereon, spaced from the first and second evaporant sources substantially different distances. A deposition mask having at least one opening therein for vapor deposition therethrough is also disposed in the vacuum chamber closely adjacent the substrate.

Thereafter a partial vacuum of less than about 1 × $10^{-5}$ torr and most desirably less than 1 × $10^{-7}$ torr is established in the vacuum chamber. The first evaporant source is then evaporated to form a first vapor, and the first vapor is influxed through the opening in the deposition mask to deposit a first layer on the substrate in a first area. Subsequently, the second evaporant source is evaporated to form a second vapor, and the second vapor is influxed through the opening in the deposition mask to deposit a second layer on the substrate in a second area which overlaps the first layer.

Other details, objects and advantages of the invention will become apparent as the following description of the presently preferred embodiments thereof and the presently preferred methods for making and practicing the same proceeds.

BRIEF DESCRIPTION OF THE DRAWINGS

In the accompanying drawings, the presently preferred embodiments of the invention and presently preferred methods of making and practicing the same area are shown, in which.

DESCRIPTION OF THE PREFERRED EMBODIMENTS

Figure 1:
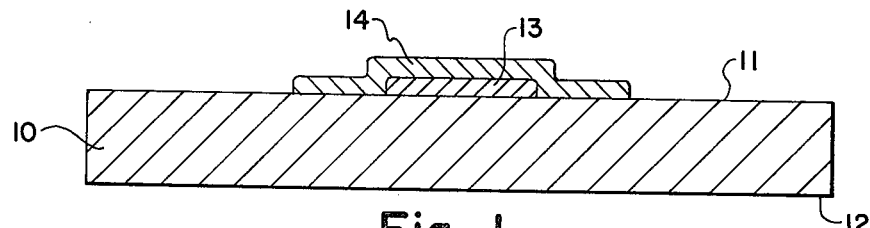
FIGS. 1 through 4 are partial cross-sectional views in elevation of an insulated-gate thin film transistor of the present invention at various stages in its manufacture.

Referring to FIG. 1, a thin film is provided on substrate 10 having opposed major surfaces 11 and 12. Substrate 10 is typically a rigid electrically insulating material such as quartz, sapphire, spinel or compensation doped silicon. Alternatively, substrate 10 may be a flexible material such as paper, polyethylene terephthlate (sold commercially under the trademark "Myler"), esters and ethers of cellulose (e.g. ethyl cellulose, cellulose acetate, and cellulose nitrate), degenerate cellulose (e.g. cellophane), polyvinyl chloride, polyvinyl chloride-acetate, polyvinyldiene chloride (sold commercially under the trademark "Saran"), nylon film, polyimide and polyamide-imide films, polytetrafluoroethylene (sold commercially under the trademark "Teflon") and polytrifluoromonochloroethylene (sold under the trademark "Kel F"). The paper may be of any type and surface texture, either rough or smooth, such as rag paper, wood pulp paper, alpha cellulose paper, or kraft paper. Playing card stock, writing stationery and newspaper script may even be used for substrate 10.

Alternatively, substrate 10 may be an electrically conductive material coated with a suitable insulating material so that the portions adjoining at least one major surface is of electrically insulating material. Specifically, substrate 10 may be comprised of a flexible metal foil, metal tape or body of a metal selected from the group consisting of nickel, aluminum, copper, tin, molybdenum, tungsten, tantalum, beryllium, silver, gold, platinum, manganese, base alloys of these, or ferrous base alloys. Portions of substrate are made electrically insulating by coating at least parts of one major surface with an electrical insulating material such as an insulating varnish. Examples of such varnishes include: polyester resins such as ethylene gylcol maleate adipatic resin, epoxy resins such as bisphenol epichlorohydrin resin, polyamide resins such as that set forth in U.S. Pat. No. 3,179,614, polyamide-imide resins such as that set forth in U.S. Pat. No. 3,179,635 silicone resins, phenolaldehyde resins, polyvinyl formed phenolic, and epoxypolyamide-imide mixtures such as that set forth in U.S. Pat. No. 3,179,630.

The thickness of substrate 10 is not critical. However, where a metal foil or tape is used, a practical minimum thickness is 200 A. Typically, the substrate is between about 1 and 10 mils in thickness, with 5 mils being most usual.

Metal conductor layer 13 of electrically conductive material such as gold, silver, platinum, aluminum, copper, tin, nickel, or indium is then disposed on major surface 11 of substrate 10 to form a gate electrode typically by evaporation deposition through a suitable deposition mask. The width of metal conductor layer 13 is preferably selected to correspond to the desired length of the channel of the field-effect transistor, and will typically be about 0.5 to 20 mils in width, with 2 mils being the most usual. The thickness of the conductor layer is typically 100 to 1000 A, depending on the power of the input signal to the gate.

Alternatively, the gate electrode (layer 13) may be formed integral with substrate 10 by providing at least a portion of the substrate of a conductive material. For example, substrate 10 may consist entirely of a flexible metal foil, metal tape or body of metal selected from the group consisting of nickel, aluminum, copper, tin, molybdenum, tungsten, tantalum, beryllium, silver, gold, platinum, magnesium, base alloys of these, or ferrous base alloys. The substrate itself is the gate electrode for the device. In this embodiment, it is preferred that an insulating layer or coating as above described be provided adjoining the major surface of the substrate everywhere but at the space between the source and drain electrodes, as hereafter described, so that the gate signal is concentrated at the channel of the transistor.

Insulator layer 14 of electrically insulating, and also preferably thermally conductive material is formed over metal conductor layer 13 and preferably extends to contact surface 11 of substrate 10 on both sides of layer 13. Insulator layer 14 is typically an electrically insulating material such as silicon dioxide, silicon monoxide, aluminum trioxide, beryllium oxide or titanium oxide. Alternatively, a glass may be used such as lead silicate, lead borate, lead borosilicate or a mixture thereof. Further, cured organic polymers may be used such as epoxy resins, polyester resins, silicone resins, polyurethane resins and polymers of hexachlorobutadiene, divinylbenezene, aryl sulfones, fluorinated alkenyls (e.g. polytetrafluoroethylene), and para-xylene. The resins may be filled up to about 20% by weight of typically 40 to 50 mesh electrical insulating, thermally conducting filler such as anodized aluminum or beryllium oxide particles.

Where the substrate 10 is the gate electrode, the insulator layer 14 is preferably an oxide of said metal such as aluminum oxide. Most desirably, substrate 10 is aluminum and insulator layer 14 is an aluminum oxide which is dense and porous. Such oxide may be formed by either plasma anodization or wet anodization. Accordingly, a particularly good method for anodizing the substrate is to deploy the substrate in a bath of 10% solution of chromium trioxide for 5 minutes using a voltage of 40 volts. The 10% solution consists of 72 grams of chromium trioxide and 800 milliliters of water.

The thickness of insulator layer 14 will, of course, vary with the desired operating voltage of the transistor. A satisfactory minimum thickness is about 300 to 500 A and typical thicknesses will range between 500 and 4,000 A. About 1,000 A is preferred if the transistor is to handle between 10 and 50 volts. A thickness of about 3,000 A is required for an operating voltage of 100 volts, a thickness of about 6,000 A is required for an operating voltage of 200 volts, a thickness of about 10,000 A is required for an operating voltage of 300 volts, and a thickness of about 20,000 A is required for an operating voltage of about 600 volts.

Figure 2:
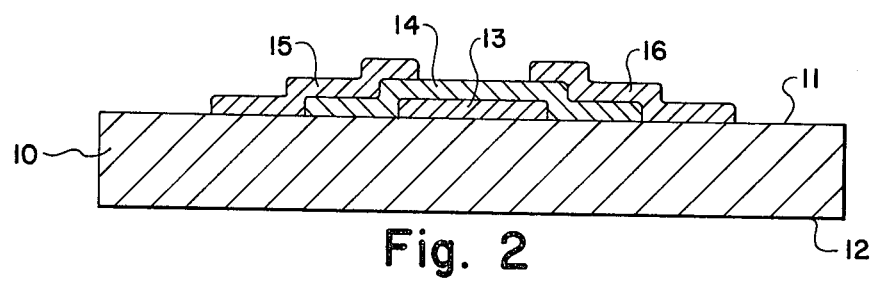

Referring to FIG. 2, source and drain electrodes 15 and 16, respectively, are disposed on insulator layer 14 and preferably extend to make contact with major surface 11 of substrate 10 on both sides of insulator layer 14. The contacting of substrate 10 is, however, possible where substrate 10 is of an electrically insulating material or coated with an electrically insulating material as above described. If substrate 10 is the gate electrode, then the electrodes may be confined to disposition on the insulator layer 14 unless an electrically insulating coating is provided away from the channel of the transistor. Source and drain electrodes 15 and 16 are spaced apart a distance corresponding to the desired length for the channel of the transistor.

The distance between the source and drain electrodes 15 and 16 is, therefore, dependent upon the desired electrical characteristics of the transistor. The shorter the distance between the source and drain electrodes, the higher will be the current rating of the transistor. However, the closer the spacing of the electrodes, the greater the possibility of voltage breakdown and thermal burn-out of the transistor. Conversely, it has been found that where the distance between the source and drain electrodes exceeds 20 mils, the current rating drops to such a degree that the usefulness of the device is substantially impaired. Satisfactory transistors have been built in which the distance between the source and drain electrodes is 0.5 mils. Accordingly, the spacing between the source and drain electrodes is typically between 0.5 and 20 mils, with 2 mils being most usual.

The electrodes are typically composed of a metal which forms an ohmic contact with the semiconductor materials subsequently used in the transistor. Illustrative of suitable metals are gold, nickel, silver, tin, indium, aluminum, copper and platinum, and base alloys thereof. Certain metals are preferred with particular semiconductor materials. For example, it is preferred to use gold or aluminum with tellurium, and to use indium with cadmium sulfide and cadmium selenide, The electrodes are preferably simultaneously formed by vapor deposition through a suitable deposition mask. The thickness to which the electrodes 15 and 16 are deposited is dependent upon the desired operating current of the transistor. The thicknesses of the electrodes will typically range from a low of about 80 A to over 1,000 A, with between 100 and 500 A being generally used.

Figure 3:
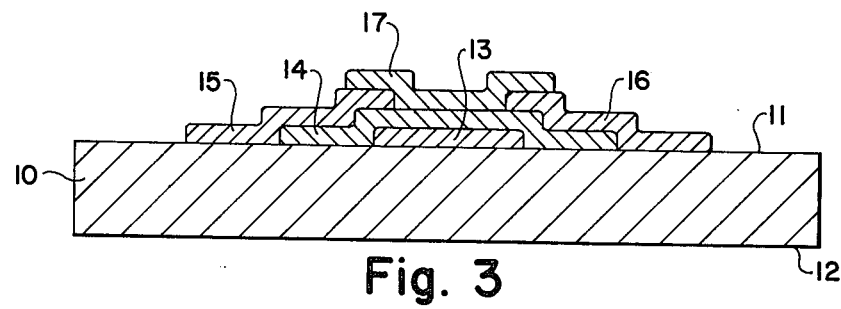

Referring to FIG. 3, first thin semiconductor layer 17 is disposed in contact with source and drain electrods 15 and 16 and in contact with insulator layer 14 at least between said source and drain electrodes 15 and 16. The semiconductor layer is typically deposited through a metallic mask by evaporation or sputter deposition. The important and critical portion of semiconductor layer 17 is that deposited between source and drain electrodes 15 and 16 in contact with insulator layer 14.

Semiconductor layer 17 may be a single crystal, polycrystalline or amorphous layer, and may consist of either an N or P-type semiconductor material. The semiconductor layer typically has a resistivity between 1 and 100 ohm-cm.

Suitable semiconductor materials for seminconductor layer 17 include: tellurium (P-type), lead telluride (P or N-type), cadmium sulfide (N-type), cadmium selenide (N-type), indium arsenide (N-type), gallium arsenide (N-type), tin dioxide (N-type), silicon (N or P-type), lead sulfide (P-type), zinc telluride (P-type), zinc sulfide (N-type), zinc selenide (N-type), zinc sulfide selenide [$ZnS_xSe_{1-x}$] (N-type), gallium phosphide (N or P-type), indium phosphide (N or P-type), aluminum antimonide (N-type), cadmium telluride (P-type), zinc oxide (N-type), gallium nitride (N or P-type), and cadmium difluoride.

The thickness of semiconductor layer 17 will vary primarily with the leakage current which can be tolerated in the transistor as hereinafter fully described. The thickness will thus vary with the semiconductor material used and the doping concentration of the semiconductor material, as well as the power capacity desired for the transistor. For example, for tellurium, the thickness will typically vary from about 40 A to about 130 A. For even higher resistivity material such as cadmium sulfide, the thickness will typically be higher, and even as high as 2,000 A.

Figure 4:
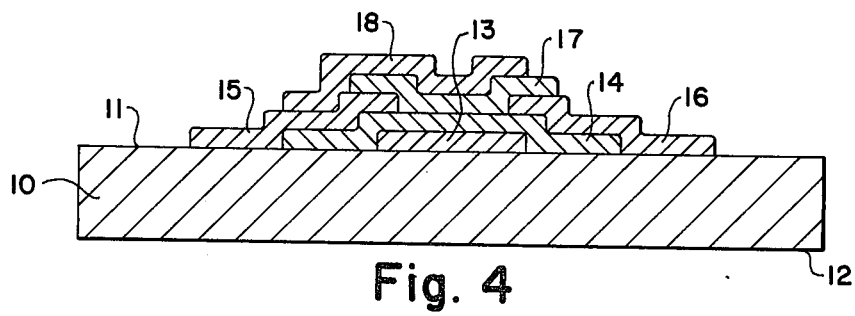

Referring to FIG. 4, second thin semiconductor layer 18 is disposed in contact with source electrode 15 without contacting drain electrode 16, and in contact with semiconductor layer 17 at least between source and drain electrodes 15 and 16. The semiconductor layer is again typically deposited through a metallic mask by evaporation or sputter deposition.

Second semiconductor layer 18 may be a single crystal, polycrystalline or amorphous layer and may consist of either an N-type or P-type semiconductor material. The resistivity of semiconductor layer 18 will generally range from $1 \times 10^{-4}$ to $1 \times 10^8$ ohm-cm and will typically be between 0.1 and 1000 ohm-cm, with about 10 ohm-cm being most usual. Semiconductor layer 18 must, however, be of opposite type conductivity from semiconductor layer 17 so that a PN junction and preferably a PN heterojunction is formed between the two semiconductor layers. Illustrative of suitable semiconductor materials are the same as those described with respect to semiconductor layer 17, but different from 17. Preferably, the thickness of second semiconductor layer 18 corresponds essentially to the thickness of first semiconductor layer 17.

If desired, the field-effect transistor may be passivated from atmospheric effects by depositing an insulating layer (not shown) over semiconductor layer 18. Examples of such compositions for a passivating layer are silicon dioxide, silicon monoxide, aluminum oxide, silicone resins and epoxy resins, which provides essentially air tight, electrically insulating coatings.

In operation of the thin film transistor, the heterojunction formed between the semiconductor layers 17 and 18 causes a space-charge or depletion region which spreads into both semiconductor layers. That is, a region without mobile carries as a result of the difference between the potential of the respective carriers in each layer. Consequently, the conducting channel of the field effect transistor in semiconductor layer 17 is reduced in cross-sectional area. Further, semiconductor layer 18 is connected ohmically to source electrode 15 so that the gate potential is equal to the source potential. Thus, the channel of the field effect transistor in semiconductor layer 17 can be completely depleted by making the thickness of the semiconductor layer 17 smaller than the width of the depletion region into semiconductor layer 17 by reason of the PN junction and preferred heterojunction.

Alternatively, layer 18 may be a metal suitable for forming a Schottky-barrier junction with semiconductor layer 17 between source and drain electrodes 15 and 16. It is, indeed, preferred that layer 18 be made of metal and form a Schottky-barrier junction with semiconductor layer 17. The width of the depletion layer spread into the channel of the field effect transistor is greatest when layer 18 creates a Schottky-barrier junction instead of a heterojunction. Suitable metals for layer 18 will, of course, vary with the composition of the semiconductor material composing layer 17 and are known. Illustrative is platinum, where semiconductor layer 17 is cadmium sulfide, and gold where semiconductor layer 17 is cadmium selenide.

In the case of a Schottky-barrier junction, the width (W) of depletion layer in semiconductor layer 17 is given by:

$$W = \sqrt{\frac{2\kappa\epsilon_o V_{bi}}{qN_B}}$$

where:

$V_{bi}$ is the built-in voltage;

$N_B$ is the concentration of carriers in the semiconductor layer 17;

$\kappa$ is the dielectric constant of the semiconductor layer 17;

$\epsilon_o$ is the permittivity of free space; and $q$ is the electron charge.

Using this formula, the width of the depletion layer can be calculated knowing the built-in voltage and the doping concentration through semiconductor layer 17. For example, a platinum-cadmium sulfide Schottky-barrier, which is known to have a built-in voltage $V_{bi}$ of 1.2 volts (see Goodman, J. Appl. Phys. 35, 573 (1964)), with a doping concentration of $1 \times 10^{17}$ per cm$^3$, the depletion width is calculated to be 1240 A. Similarly, a gold-cadmium selenide Schottky-barrier, which is known to have a built-in voltage of 0.49 volts (see Mead, Appl. Phys. Lett. 6, 103 (1965)), with a doping concentration of $1 \times 10^{17}$ per cm$^3$, the depletion layer width is calculated to be 736 A.

Available data does not allow reliable calculations of the depletion width in the heterojunctions of the II–VI semiconductor materials. However, qualitative information available shows a depletion width of the same order of magnitude with a heterojunction that is calculable for a corresponding Schottky-barrier junction.

Figure 5:
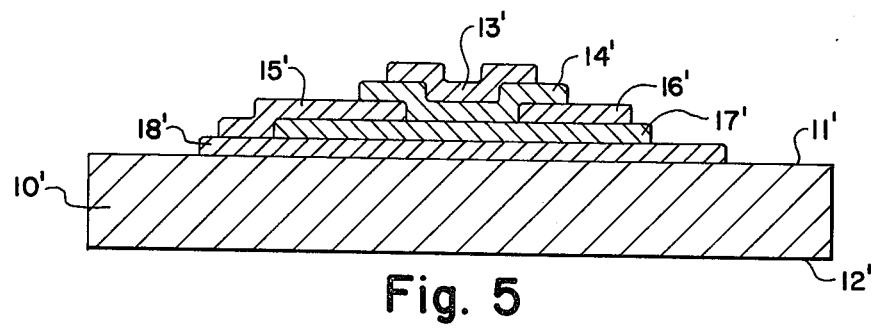
FIG. 5 is a cross-sectional view in elevation of an alternative insulated-gate thin film transistor of the present invention.

Referring to FIG. 5, an alternative embodiment of the invention is shown where the structure is inverted. The corresponding parts have been given prime numbers to those stated above in the description in connection with the embodiment shown in FIGS. 1 through 4. The compositions and dimensions of the layers and components are as above described in connection with the corresponding parts. Substrate 10' must be an electrically insulating material at least adjacent portions of major surface 11' where semiconductor layer or metal layer 18' contacts major surface 11'.

To illustrate the operation of the present invention, a gate-insulatd thin film transistor similar to that described above in connection with FIGS. 1 through 4 was made utilizing a P-type tellurium semiconductor layer 17 and a N-type cadmium selenide semiconductor layer 18. The operating characteristics of the transistor were then measured in gate voltage increments of 0.5 volts. The measured operating characteristics of the transistor are shown in FIG. 6.

Figure 6:
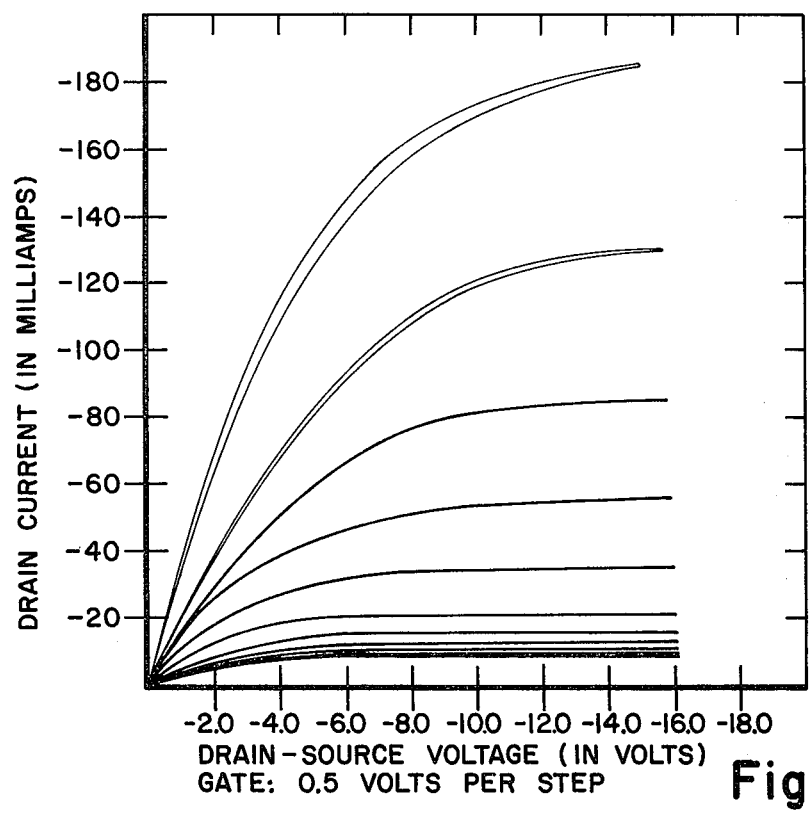
FIGS. 6 and 7 are graphs showing the electrical characteristics of an insulated-gate thin film transistor of the present invention.
Figure 7:
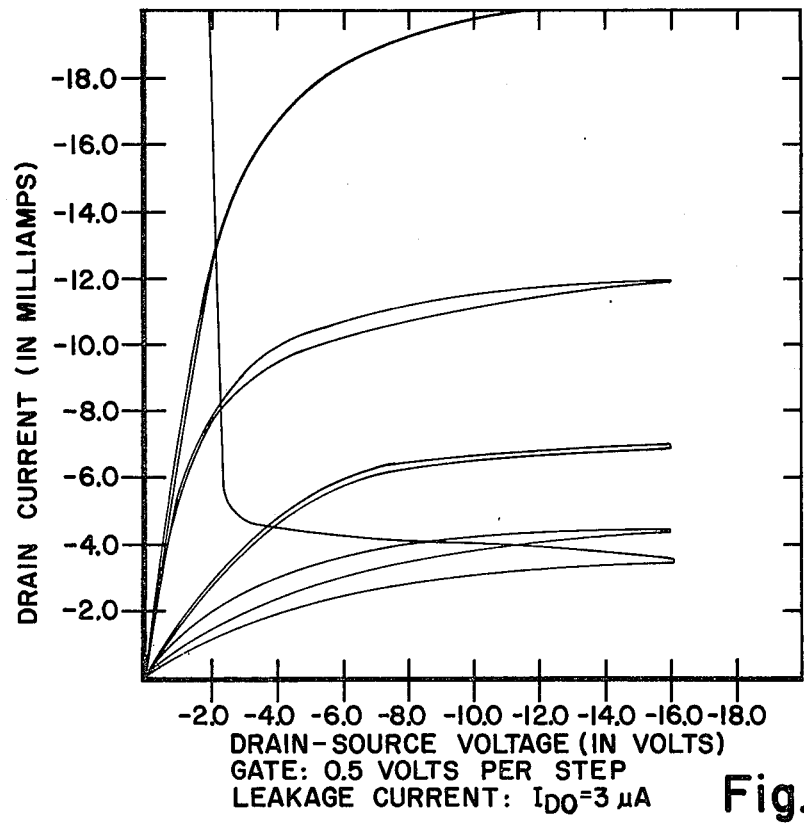

Referring to FIG. 7, the same operating characteristics of the device are shown with the vertical scale magnified by a factor of 10 greater than the vertical scale on FIG. 6. From FIG. 7, it is seen that the drain leakage current is 3 microamps. Compared with the same tellurium transistor without the heterojunction, this leakage current is about a factor of 10 less.

The insulated-gate thin film transistor of the present invention can be made by any known suitable vacuum deposition method. Preferably, however, a sequential evaporation deposition technique is used as hereinafter described to reduce the number of fabrication steps in making the transistor. More importantly, the sequential evaporation deposition method deposits sequential layers through the same deposition mask, thereby eliminating alignment problems and increasing the quantitive yield in manufacture.

Figure 8:
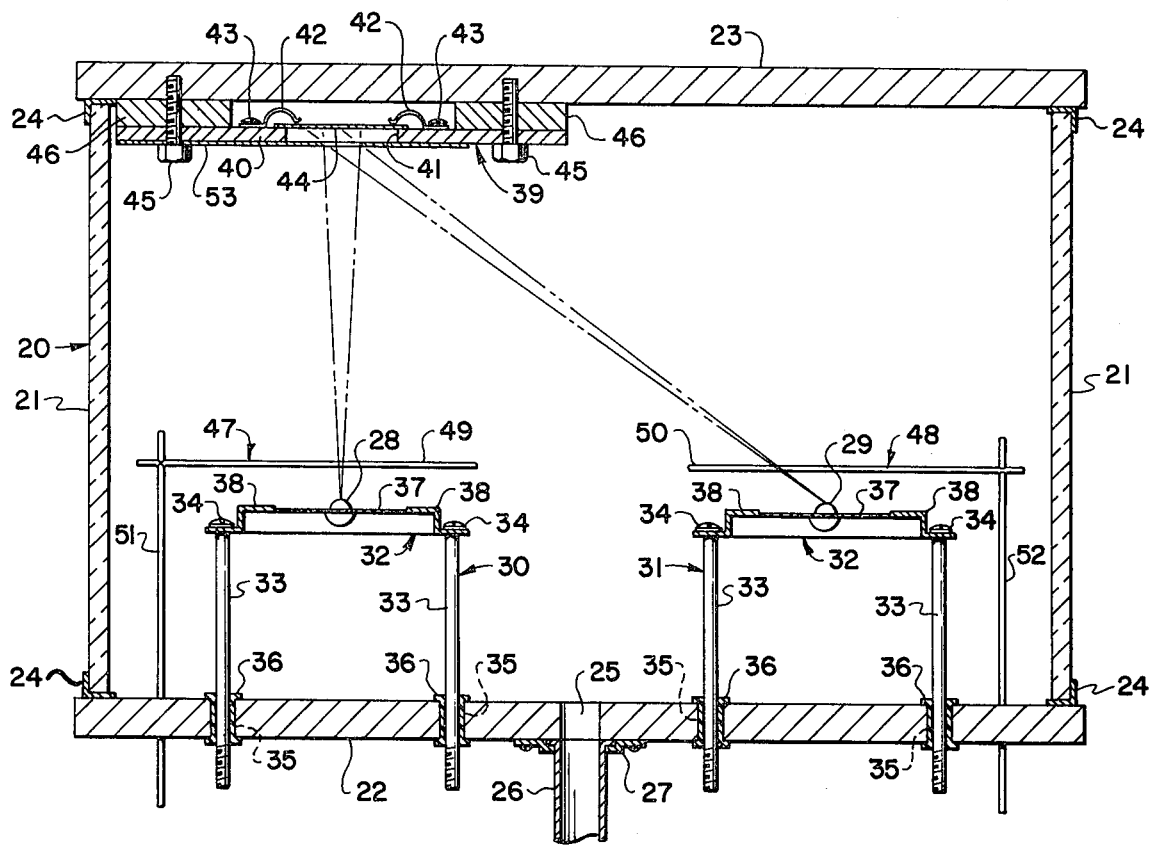
FIG. 8 is a cross-sectional view in elevation of apparatus suitable for performing an evaporation deposition in accordance with the present invention.

Referring to FIG. 8, the thin film transistor can be fabricated in the apparatus shown. Specifically, hermetically sealed chamber 20 is comprised of cylindrical sidewalls 21 of non-porous material such as a metal, glass or ceramic, and of circular end caps 22 and 23 of an electrically conductive material such as low carbon steel or aluminum. Sidewalls 21 are typically vertically positioned, and end caps 22 and 23 are typically horizontally positioned. Cylindrical sidewalls 21 are hermetically sealed to the end caps 22 and 23 by standard L-shaped seals 24 to provide for ease in assembly and disassembly of the chamber 20 for disposition and removal of apparatus to and from the chamber.

A vacuum port 25 is provided in end cap 22 at the center. Vacuum portion 25 is hermetically sealed to conduit 26 by flange 27. Conduit 26 communicates with a standard oil diffusion, vacuum pump (not shown) to enable a partial vacuum of typically less than $1 \times 10^{-5}$ torr and more desirably less than $1 \times 10^{-7}$ torr to be established and maintained in chamber 20 after it is hermetically sealed. Also, typically, positioned in conduit 26 between chamber 20 and the vacuum pump is a standard liquid nitrogen cold trap (not shown) to remove volatile products from the vacuum.

Formed and subsequently disposed in chamber 20 are first and second evaporant sources 28 and 29. Sources 28 and 29 are preferably pelletized to avoid spitting during deposition, and most desirably are high density pellets to avoid volume changes and outgassing difficulties during evaporation. Evaporation sources 28 and 29 are positioned in spaced relation from each other in chamber 20 on first and second evaporant source heaters 30 and 31, respectively. Each heater 30 and 31 includes horizontally positioned heater element 32, which is fastened to the ends of rods 33 by cap screws 34. Rods 33 are vertically positioned in openings 35 in end cap 22 by insulating grommets 36, and are also hermetically sealed and electrically insulate from end cap 22. First and second heaters 30 and 31 can thus be electrically connected through rods 33 to a standard power supply and control circuit positioned externally of chamber 10.

Also, each heater element 32 of source heaters 30 and 31, has a raised thin central portion 37 (e.g. 5 mils in thickness) and a thick L-shaped periphery portion 38 (e.g. 60 mils in thickness). Thin central portion 37 provides a high electrical resistance region where evaportant source 28 or 29 is supported. By this arrangement, the evaporant sources 28 and 29 can be sequentially evaporated at separately, precisely controlled rates by resistance heating of the respective central portions 37 of heater 30 and 31.

Alternatively, source heaters 30 and 31 may be induction heaters or electron bombardment heaters, see Holland, *Thin Film Microelectronics*, pp. 231–39 (1965). In this connection, it should be noted that electron beam deposition has been found to be particularly good in avoiding contamination of the source because the molten material is always supported in a boat on a high purity evaporant source so that the molten material never comes in contact with the evaporation boat or hearth.

Also supported within the chamber 20 from end cap 23 is substrate holder or magazine 39. Holder 39 includes a holder plate 40, typically of circular shape, that has a typically circular or rectangular deposition opening 41 disposed in the center thereof. The assembly also includes mechanical bias means 42 fastened to the holder plate 40 by cap screws 43. By this arrangement substrate 44, which has been previously prepared for vapor deposition thereon by standard methods, can be mounted in the holder plate 40 over the deposition opening 41 by mechanically biasing bias means 42 against holder plate 40. In turn, holder plate 40 is supported from end cap 23 by cap screws 45 which extend through openings in holder plate 40 and annular spacer plate 46 and thread into tapped openings in end cap 23 as shown.

By this arrangement, substrate 44 is disposed in vacuum chamber 20 spaced from first and second evaporant sources 28 and 29 substantially different distances. Specifically, evaporant source 28 is spaced substantially axially to deposition opening 51 in holder plate 40 and substantially normal to substrate 44, while evaporant source 29 is spaced offset from the deposition opening 41 in holder plate 40.

Also disposed in chamber 20 are first and second shutter assemblies 47 and 48. Assemblies 47 and 48 include shutters 49 and 50, respectively, disposed horizontally immediately above evaporant sources 28 and 29, respectively, to cut off the flow of vapor from the sources to the substrate. Shutters 49 and 50 are fastened at a peripheral point to rods 41 and 52, respectively, which extend through and hermetically seal with end cap 22. By this arrangement, shutter assemblies 47 and 48 are able to independently pivot shutters 40 and 50 to permit vapor from the first and second evaporant sources 28 and 29 to sequentially influx toward the substrate 44. In operation, the evaporant sources can thus be degassed and the evaporation rates of evaporant sources independently stabilized with the respective shutters 49 and 50 closed, and thereafter the shutters sequentially opened and the sequential evaporation deposition performed, see e.g. Holland, *Thin Film Microelectronics*, p. 238 (1965).

Also disposed within chamber 20 immediately adjacent to holder plate 40, supported by cap screw 45, is deposition mask 53. Deposition mask 53, typically of a metal sheet, selectively masks portions of evaporation opening 41 so that the vapor is influxed through mask 53 to deposit only on selected areas of substrate 44. By this arrangement, vapor from first evaporant source 28 can be influxed through deposition mask 53 substantially normal to deposition surfaces of substrate 44.

Figure 9:
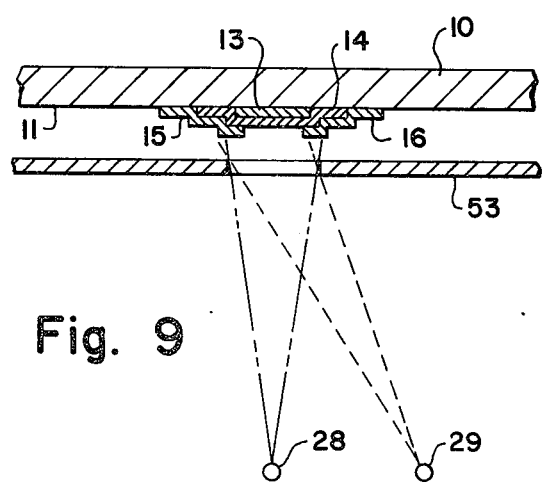
FIG. 9 is an exploded fragmentary view of a portion of the evaporation deposition apparatus shown in FIG. 8.

Referring to FIG. 9, the sequential vapor deposition in accordance with the present invention is shown more clearly utilizing the apparatus as described in connection with FIG. 8. Specifically, only one deposition mask 53 is needed for the sequential depositions of semiconductor layers 17 and 18. Specifically, semiconductor layer 17 is first evaporated and deposited from evaporant source 28 onto the substrate, which already has source and drain electrodes 15 and 16 in position (see FIG. 2). Deposition mask 53 is positioned symmetrically of source and drain electrodes 15 and 16. First vapor from first evaporant source 28 is thus influxed through deposition mask 53 and the vapor of semiconductor layer 17 is deposited on a first area (as also shown in FIG. 3) of substrate 44 in contact with the source and drain electrodes 15 and 16 and insulator layer 14 between the source and drain electrodes.

Thereafter, semiconductor or metal layer 18 is vapor deposited from second evaporant source 29. Second vapor from second evaporant source 29 is influxed through deposition mask 53 at an oblique angle with respect to mask 53 and substrate 44, and the vapor of layer 18 is deposited on a second area of substrate 44 (as also shown in FIG. 4) overlapping the first area in contact with source electrode 15 without contacting drain electrode 16 and in contact with semiconductor layer 17 between source and drain electrodes 15 and 16.

It is readily apparent that the sequential deposition of semiconductor layers 17 and 18 in this way reduces the fabrication steps and the time for fabricating the device. More importantly, the two layers 17 and 18 can be readily aligned relative to each other and relative to the space between the source and drain electrodes and the quantitative yield of the device in manufacture can be correspondingly increased.

The deposition method of the present invention can also be adapted to automatic vacuum deposition apparatus. Illustrative of such automatic appparatus is that described in U.S. Pat. No. 3,657,613, granted Apr. 18, 1972 and assigned to the same assignee as the present application.

While the preferred embodiments of the invention have been shown and described with particularity, it is distinctly understood that the invention may be otherwise variously embodied and utilized within the scope of the following claims.

What is claimed is:

1. An insulated-gate thin film transistor comprising:
    A. a substrate having opposed major surfaces and including electrically insulating material adjoining at least part of one major surface;
    B. a conductor layer of an electrically conductive material disposed on at least one major surface of the substrate adjoining an electrically insulating material to form a gate electrode;
    C. an insulator layer of an electrically insulating material disposed on the conductor layer;
    D. source and drain electrodes of electrically conductive material disposed on the insulator layer, said source and drain electrodes being spaced away from each other;

E. a first thin semiconductor layer of semiconductor material in contact with said source and drain electrodes and in contact with said insulator layer at least between said source and drain electrodes; and F. a second thin semiconductor layer of semiconductor material in contact with the source electrode without contacting said drain electrode and in contact with said first semiconductor layer at least between said source and drain electrodes, said second semiconductor layer being of the opposite type conductivity from the first semiconductor layer and forming a PN junction with said first semiconductor layer between the source and drain electrodes.

2. An insulated-gate thin film transistor as set forth in claim 1 wherein:
the substrate is formed entirely of an electrically insulating material, and the insulator layer covers the conductor layer.

3. An insulated-gate thin film transistor as set forth in claim 1 wherein:
the second thin semiconductor layer forms a heterojunction with the first thin semiconductor layer.

4. An insulated-gate thin film transistor comprising:
A. a substrate having opposed major surfaces and including electrically insulating material adjoining at least a part of one major surface;
B. a conductor layer of an electrically conductive material on at least one major surface of the substrate adjoining an electrically insulating material to form a gate electrode;
C. an insulator layer of an electrically insulating and thermally conductive material disposed on the conductor layer;
D. source and drain electrodes of electrically conductive material disposed on said insulator layer, said source and drain electrodes being spaced apart from each other;
E. a thin semiconductor layer of semiconductor material in contact with the source and drain electrodes and in contact with the insulator layer at least between the source and drain electrodes; and
F. a metal layer in contact with the source electrode without contacting said drain electrode and in contact with said semiconductor layer at least between said source and drain electrodes, said metal layer of a material forming a Schottky-barrier junction with said semiconductor layer at least between the source and drain electrodes.

5. An insulated-gate thin film transistor as set forth in claim 4 wherein:
the substrate is formed entirely of an electrically insulating material, and the insulator layer covers the conductor layer.

6. An insulated-gate thin film transistor comprising:

A. a substrate having opposed major surfaces and including an electrically insulating material adjoining at least part of one said major surface;
B. a first thin semiconductor layer of semiconductor material disposed on at least one major surface of the substrate adjoining electrically insulating material;
C. a second thin semiconductor layer of semiconductor material disposed on the first semiconductor layer, said semiconductor layer being of an opposite type conductivity from the first semiconductor layer and forming a PN junction with the first semiconductor layer;
D. source and drain electrodes of electrically conductive material disposed in contact with the second semiconductor layer, said source and drain electrodes being spaced apart from each other, and said source electrode also being in contact with the first semiconductor layer without said first semiconductor layer contacting said drain electrode;
E. an insulator layer of an electrically insulating material in contact with said source and drain electrodes and the second semiconductor layer at least between the source and drain electrodes; and
F. a conductor layer of electrically conductive material disposed on the insulator layer at least between the source and drain electrodes to form a gate electrode.

7. An insulated-gate thin film transistor as set forth in claim 6 wherein:
the second thin semiconductor layer forms a heterojunction with the first thin semiconductor layer.

8. An insulated-gate thin film transistor comprising:
A. a substrate having opposed major surfaces and including electrically insulating material adjoining at least part of one of said major surface;
B. a layer of electrically conductive material disposed on at least one major surface of the substrate adjoining an electrically insulating material;
C. a thin semiconductor layer of semiconductor material disposed on the metal layer, said semiconductor layer forming a Schottky-barrier junction with said metal layer;
D. source and drain electrodes of electrically conductive material disposed on the semiconductor layer, said source and drain electrodes being spaced away from each other, and said source electrode also being in contact with said metal layer without said metal layer contacting said drain electrode;
E. an insulator layer of an electrically insulating material in contact with said source and drain electrodes and the semiconductor layer at least between the source and drain electrodes; and
F. a conductor layer of electrically conductive material disposed on the insulator layer at least between the source and drain electrodes to form a gate electrode.

* * * * *